(12) United States Patent
Sundblad et al.

(10) Patent No.: US 8,344,759 B2
(45) Date of Patent: Jan. 1, 2013

(54) TRACK AND HOLD CIRCUIT

(75) Inventors: Rolf Sundblad, Ljungsbro (SE); Staffan Gustafsson, Linkoping (SE)

(73) Assignee: CSR Technology Inc., Sunnyvale, CA (US)

(*) Notice: Subject to any disclaimer, the term of this patent is extended or adjusted under 35 U.S.C. 154(b) by 0 days.

(21) Appl. No.: 13/545,690

(22) Filed: Jul. 10, 2012

(65) Prior Publication Data

US 2012/0280722 A1 Nov. 8, 2012

Related U.S. Application Data

(62) Division of application No. 12/279,467, filed as application No. PCT/EP2007/050504 on Jan. 18, 2007, now Pat. No. 8,222,926.

(30) Foreign Application Priority Data

Feb. 17, 2006 (EP) .................................... 06110121

(51) Int. Cl.
*G11C 27/02* (2006.01)

(52) U.S. Cl. ............................................ 327/94; 327/91

(58) Field of Classification Search ............... 327/91–96
See application file for complete search history.

(56) References Cited

U.S. PATENT DOCUMENTS

| | | | | |
|---|---|---|---|---|
| 5,448,189 A * | 9/1995 | Lacroix et al. | ................... | 327/91 |
| 6,020,769 A * | 2/2000 | Vallancourt | ....................... | 327/94 |
| 6,028,467 A * | 2/2000 | Burrows et al. | ................ | 327/331 |
| 6,198,314 B1 * | 3/2001 | Kase | ................................ | 327/94 |
| 6,255,865 B1 * | 7/2001 | Opris | ............................... | 327/94 |
| 6,323,697 B1 * | 11/2001 | Pavan | ............................. | 327/94 |
| 6,525,574 B1 * | 2/2003 | Herrera | ............................ | 327/94 |
| 7,453,291 B2 * | 11/2008 | Song | .............................. | 327/91 |
| 7,696,792 B2 * | 4/2010 | Hsu | .................................. | 327/94 |
| 8,222,926 B2 * | 7/2012 | Sundblad et al. | ................ | 327/94 |

FOREIGN PATENT DOCUMENTS

| | | |
|---|---|---|
| JP | 2000 134097 A | 5/2000 |
| WO | 2005/013284 A1 | 2/2005 |

OTHER PUBLICATIONS

International Search Report corresponding to PCT/EP2007/050504, mailing date of Jun. 8, 2007.
International Preliminary Report on Patentability corresponding to PCT/EP2007/050504, mailing date of Jun. 8, 2007.
Mohamed, Zin et al., "A high-speed CMOS track/hold circuit", Electronics, Circuits and Systems, 1999. Proceedings of ICECS '99, The 6th IEEE International Conference on Pafos, Cyprus Sep. 5-8, 1999, Piscataway, NJ, USA, IEEE, US, vol. 3, Sep. 5, 1999, pp. 1709-1712.

* cited by examiner

*Primary Examiner* — Hai L Nguyen
(74) *Attorney, Agent, or Firm* — Lando & Anastasi, LLP

(57) ABSTRACT

A track and hold circuit that includes a switch device and a capacitive hold device. The track and hold circuit includes a track-voltage generating device adapted to generate a control voltage based on a signal on an input terminal of the switch device and supply the control voltage to the switch device during track phases of the track and hold circuit. The control voltage provides a channel charge, which is the same for each track phase, in the switch device.

16 Claims, 9 Drawing Sheets

TRACK AND HOLD CIRCUIT

CROSS-REFERENCE TO RELATED APPLICATIONS

This application is a division, under 35 U.S.C. §§120 and 121, of U.S. patent application Ser. No. 12/279,467, filed Aug. 14, 2008 and titled "TRACK AND HOLD CIRCUIT," which is incorporated herein by reference in its entirety. U.S. patent application Ser. No. 12/279,467 is a U.S. National Phase entry under 35 U.S.C. §371 of International Application Serial No. PCT/EP2007/050504 filed Jan. 18, 2007 and titled "TRACK AND HOLD CIRCUIT."

TECHNICAL FIELD OF THE INVENTION

The present invention relates to a track and hold circuit.

DESCRIPTION OF RELATED ART

A track and hold circuit is used in e.g. analog-to digital converters (ADCs) and discrete-time analog filters as a front-end interface for generating a discrete-time analog signal from a continuous-time analog signal. During a track phase of the track and hold circuit, an output of the track and hold circuit ideally follows an analog input signal of the track and hold circuit. During a hold phase, the output of the track and hold circuit is ideally held constant at the level of the analog input signal of the track and hold circuit at the beginning of the hold phase.

As an example, track and hold circuits used in existing ADCs in computer displays such as VGA projectors and LCD monitors are capable of providing a bandwidth and a signal-to-noise-and-distortion ratio sufficient to obtain 8 bits of effective resolution and a sample rate of 270 Msamples/s. In the future, the requirements may be in the order of 12 bits of effective resolution and sample rates in the order of 400 Msamples/s, or even higher. Existing track and hold circuits are insufficient for meeting such requirements.

The track and hold circuit may be implemented with a switch device connected to the input of the track and hold circuit at a first terminal of the switch device and to a capacitive hold device at a second terminal of the switch device. The capacitive hold device may, e.g., be a parallel-plate capacitor. The switch device may, e.g., be a transistor, such as an NMOS transistor. During the track phase, a first voltage may be applied to a gate terminal of the NMOS transistor for setting the NMOS transistor in a conducting state. During the hold phase, a second voltage may be applied to the gate terminal of the NMOS transistor for setting the NMOS transistor in a nonconducting state. Advantages with this type of track and hold circuit are that it may be simple to implement and require a relatively small circuit area. Disadvantages are, e.g., that the on resistance and the channel charge of the switch device vary with the input signal. This, in turn, causes nonlinear operation of the track and hold circuit, e.g., due to nonlinear settling a channel-charge injection from the switch device in the transition from the track phase to the hold phase, which degrades the overall signal-to-noise-and-distortion ratio (SNDR). Hence, this type of track and hold circuit may be insufficient in a context where a high SNDR is required, such as the high-speed and high-resolution video applications mentioned above.

SUMMARY OF THE INVENTION

It is an object of the present invention to provide a wide-band track and hold circuit with improved signal-to-noise-and-distortion-ratio (SNDR).

According to a first aspect, a track and hold circuit comprising a switch device and a capacitive hold device further comprises a track-voltage generating device. The track-voltage generating device is adapted to generate a control voltage based on a signal on an input terminal of the switch device and supply the control voltage to the switch device during track phases of the track and hold circuit. Said control voltage provides a channel charge, which is the same for each track phase, in the switch device.

The switch device may include a first MOS transistor arranged to receive the control voltage at the gate terminal. The first MOS transistor may be an NMOS transistor or a PMOS transistor.

The track-voltage generating device may include a diode-connected second MOS transistor arranged to be biased with a DC current. The source terminal of the diode connected second MOS transistor may be connected to an input terminal of the switch device. The first MOS transistor and the second MOS transistor may either be both NMOS transistors or be both PMOS transistors.

The track-voltage generating device may include a third MOS transistor, the drain and source terminals of which may be shorted. The third MOS transistor may be arranged to be charged with a predetermined electrical charge during the hold phase. The third MOS transistor may further be arranged to generate said control voltage during the track phase by redistribution of a predetermined fraction of said predetermined charge to the first MOS transistor. The first MOS transistor and the third MOS transistor may either be both NMOS transistors or be both PMOS transistors.

The track and hold circuit may further include a buffer device operatively connected to the input terminal of the switch device.

The buffer device may include at least one MOS transistor connected in a source-follower configuration. All of the at least one MOS transistor may either be NMOS transistors or PMOS transistors.

Individual MOS transistors of the at least one MOS transistor and bias currents for the individual MOS transistors of the at least one MOS transistor may be selectively enabled.

The track and hold circuit may have a differential structure.

According to a second aspect, an analog-to-digital converter comprises the track and hold circuit.

According to a third aspect, an electronic apparatus comprises the track and hold circuit. The electronic apparatus may be but is not limited to a monitor, a projector, a television set, or a radio transceiver.

It is an advantage that channel-charge injection from the switch device into the capacitive hold device will not give rise to a nonlinearity error in the output of the track and hold device. Thereby, the overall nonlinearity of the track and hold circuit may be relatively low. It is a further advantage that improved SNDR may be obtained with only a relatively small amount of hardware in addition to the switch device and the capacitive hold device. Hence, the cost in terms of circuit area and power dissipation may be relatively low. 15 It is also advantageous that the improvement of SNDR is, at least in part, based on matching, such as threshold-voltage matching, between two components of the same type, for example NMOS transistors or PMOS transistors. By implementing the two components that should be matched on the same chip and placing them closely together, e.g. using an interdigitized layout, good matching may be obtained.

Further embodiments of the invention are defined in the dependent claims.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of the invention will appear from the following detailed description of the invention, reference being made to the accompanying drawings, in which:

FIG. 4d is a schematic circuit diagram of an embodiment of a track-voltage generating device for the track and hold circuit of FIG. 4a;

DETAILED DESCRIPTION OF EMBODIMENTS

Figure 1A:
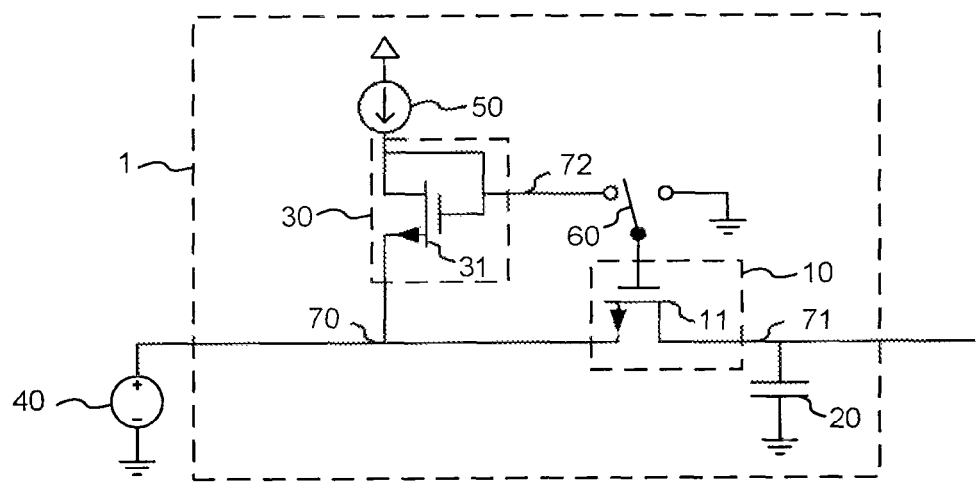
FIG. 1a is a schematic circuit diagram of a track and hold circuit according to an embodiment.

FIG. 1a shows an embodiment of a track and hold circuit 1. In the embodiment, a switch device 10 embodied with an NMOS transistor 11 is included. For the NMOS transistor 11, a first order approximation of the channel charge, $Q_{CH}$, is $$Q_{CH} \approx -WLC_{OX}(V_{GS}-V_T)$$

where W is a channel width of the NMOS transistor 11, L is a channel length of the NMOS transistor 11, $V_{GS}$ is the gate-to-source voltage of the NMOS transistor 11, $V_T$ is the threshold voltage of the NMOS transistor 11, and $C_{OX}$ is the gate-oxide capacitance per unit area of the NMOS transistor 11.

A first order approximation of the on resistance of the NMOS transistor 11 is $$R_{ON} \approx \frac{L}{\mu_o C_{OX} W(V_{GS} - V_T)}$$

where $\mu_o$ is an electron mobility for the NMOS transistor 11.

The track and hold circuit 1 further comprises a track-voltage generating device 30. The track-voltage generating device 30 may be adapted to track threshold voltage variations of the switch device 10 and to generate a control voltage for the switch device 10 during the track phase. The generated control voltage is such that $R_{ON}$ and $Q_{CH}$ are constant during the track phase and have the same values for each track phase. For example, the control voltage generated by the track-voltage generating device 30 may be such that the effective gate-to-source voltage, $V_{EFF} = V_{GS} - V_T$, of the NMOS transistor 11 is constant during the track phase and equal for each track phase. Thereby, $R_{ON}$ is constant during the track phase and equal for each track phase. Hence, the switch device 10 is linear during the track phase. Further, $Q_{CH}$ is constant during the track phase and equal for each track phase.

In the embodiment of FIG. 1a, the track-voltage generating device 30 comprises an NMOS transistor 31. The bulk terminals (not shown) of the NMOS transistors 11 and 31 are both connected to a common node, such as ground. A voltage source 40 for supplying the input signal to the track and hold circuit 1 is connected to a node 70 of the track and hold circuit 1. The voltage source 40 is not a part of the track and hold circuit. It is only included in FIG. 1a to put the track and hold circuit in a context. In the embodiment shown in FIG. 1, the node 70 is an input node of the track and hold circuit 1. The NMOS transistor 31 in the track-voltage generating device 30 is diode connected, i.e., it has its gate terminal connected to its drain terminal. The NMOS transistor 31 is biased with a constant DC current $I_{bias}$ generated by a current source 50 connected between the gate terminal of the NMOS transistor 31 and a supply voltage ($V_{DD}$) of the track and hold circuit 1. The current source 50 may e.g. be implemented with a single PMOS transistor with a bias voltage applied to its gate terminal. Alternatively, the current source 50 may include at least one cascode transistor, e.g., for increasing the output resistance of the current source 50. The source node of the NMOS transistor 31 and the input node of the switch device 10 are both connected to the node 70. A capacitive hold device 20, embodied as a capacitor, is connected between ground and an output node 71 of the switch device 10. The node 71 may be an output of the track and hold circuit. A first control switch 60 is connected to the gate terminal of NMOS transistor 11. The first control switch 60 is adapted to selectively connect the gate terminal of the NMOS transistor 11 either to ground, during the hold phase, or to an output node 72 of the track-voltage generating device 30, during the track phase.

Figure 1B:
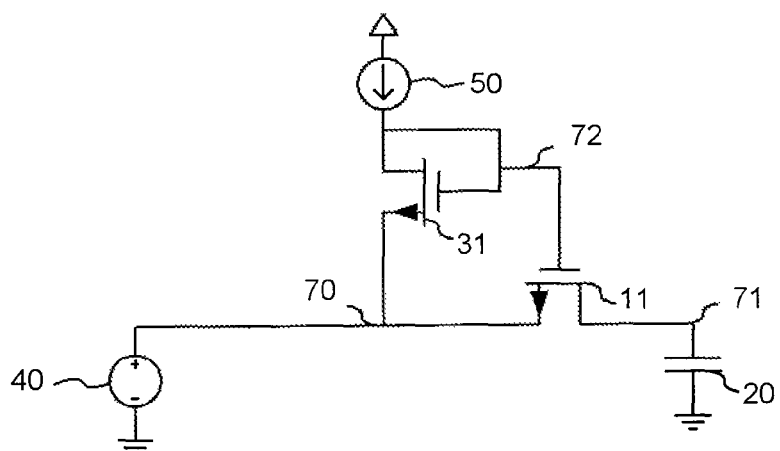
FIG. 1b is a simplified schematic circuit diagram of the track and hold circuit of FIG. 1a during a track phase.

A simplified schematic view of the track and hold circuit 1 during the track phase is shown in FIG. 1b. Since the NMOS transistor is diode connected, it is in a saturated mode and its effective gate-to-source voltage is to a first order approximation given by $$V_{EFF} \approx \frac{2I_{bias}L}{\mu_0 C_{OX} W}$$

Since the NMOS transistors 31 and 11 are both connected to the node 70, they have approximately the same threshold voltage $V_T$. Hence, in this embodiment, the track-voltage generating device 30 tracks the threshold voltage variations in the NMOS transistor 11 in that the threshold voltage of the NMOS transistor 31 in the track-voltage generating device 30 approximately follows the threshold voltage of the NMOS transistor 11. The threshold voltage of an NMOS transistor is normally dependent on the bulk-to-source voltage $V_{BS}$ of the NMOS transistor. The source terminal of the NMOS transistor 11 is the terminal connected to the node of the nodes 70 and 71 that has the lowest electrical potential. Hence, which terminal of the NMOS transistor 11 that is the source terminal may vary during the operation of the track and hold circuit 1.

However, during the track phase, the voltage drop between nodes 70 and 71 is normally small, for example in the order of a few mV. Therefore, the bulk-to-source voltages for the NMOS transistors 11 and 31 are approximately equal even in situations where the source terminal of the NMOS transistor 11 is the terminal which is connected to the node 71.

Since the NMOS transistors 11 and 31 have approximately the same threshold voltages, they also have approximately the same value of $V_{EFF}$ during the track phase. This value of $V_{EFF}$ is, to a first order approximation, only dependent on the bias current $I_{bias}$ and not the input signal delivered at the node 70. Since $I_{bias}$ is constant, both $R_{ON}$ and $Q_{CH}$ for the NMOS transistor 11 are constant during the track phase. Further, both $R_{ON}$ and $Q_{CH}$ for the NMOS transistor 11 have the same value for each track phase. The terms "the same" and "constant" when used for describing $R_{ON}$ and $Q_{CH}$ in this specification should not be interpreted as "exactly the same" or "exactly constant." For example, due to noise, external interference, and rapidly varying signals, $V_{EFF}$ may fluctuate in the embodiments described herein. This will result in corresponding fluctuations in $Q_{CH}$ and $R_{ON}$. Quantitative values of the fluctuations may vary e.g. between different applications, operation environments, and manufacturing processes.

Figure 1C:
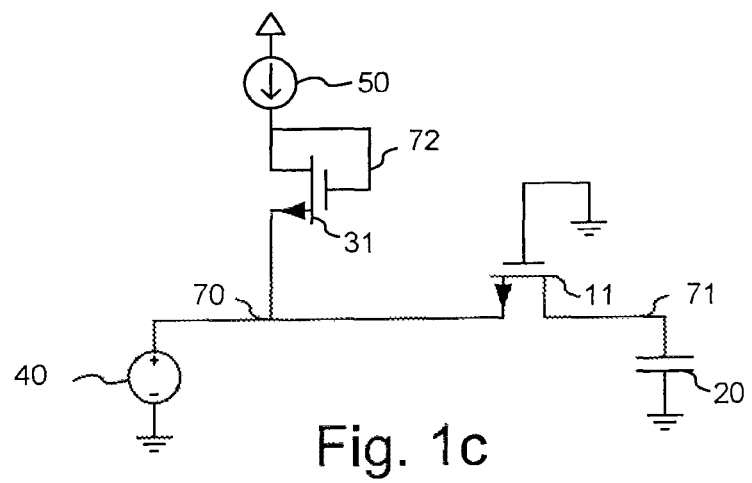
FIG. 1c is a simplified schematic circuit diagram of the track and hold circuit of FIG. 1a during a hold phase.

A simplified schematic view of the track and hold circuit 1 during the hold phase is shown in FIG. 1c. The gate terminal of the NMOS transistor 11 is connected to ground. Therefore, it is in a nonconductive state. Hence, the voltage at the node 71 is held constant and is given by the charge stored in the capacitive hold device 20. In the transition between the track phase and the hold phase, some of the channel charge from the NMOS transistor 11 will be injected into the capacitive hold device 20, changing the value of the voltage at the node 71. The injected charge is approximately $Q_{CH}/2$. Since $Q_{CH}$ is constant and equal for all track phases, the injected charge will only contribute to a DC offset error and not to a nonlinearity error, which is an advantage.

For the track and hold circuit 1 illustrated in FIGS. 1a-c, the voltage source 40 supplying the input signal needs to be adapted to sink the current $I_{bias}$ generated by the current source 50 without substantially altering the voltage generated by the voltage source 40. Hence, the track and hold circuit illustrated in FIGS. 1a-c is applicable when the voltage source 40 supplying the input signal has a low output impedance. An embodiment of a track and hold circuit 1 that is applicable for a voltage source 40 supplying the input signal regardless of the output impedance of the voltage source 40 is illustrated in FIG. 2a.

Figure 2A:
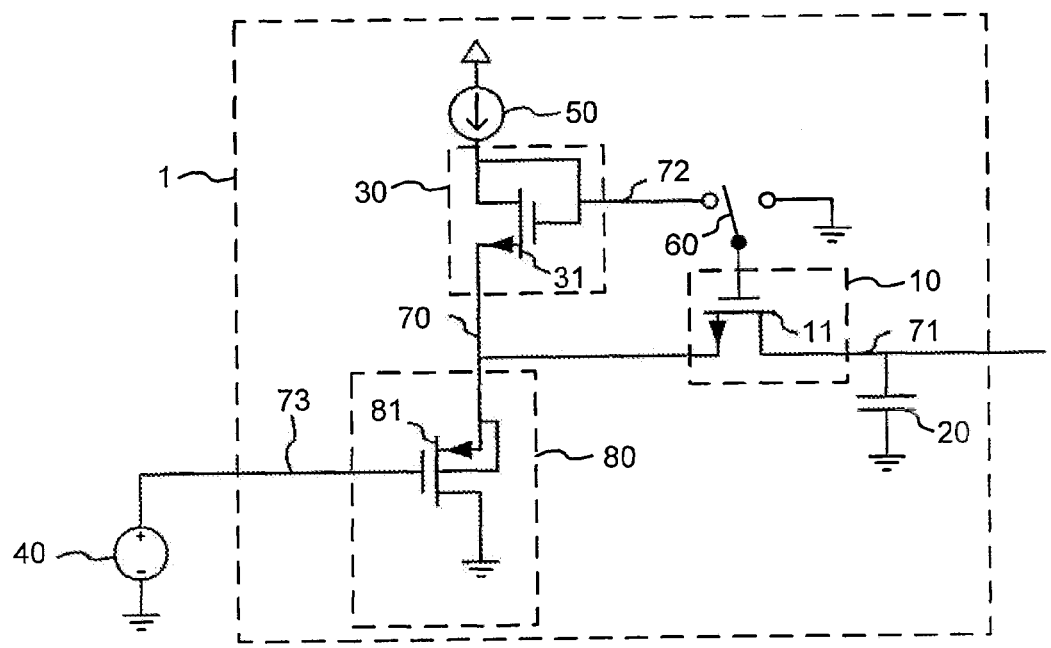
FIG. 2a is a schematic circuit diagram of a track and hold circuit according to another embodiment.

A difference between the track and hold circuits 1 in FIG. 1a and FIG. 2a is that in FIG. 2a, a buffer device 80 embodied as a PMOS transistor 81 is included to increase the input impedance of the track and hold circuit 1. The source terminal of the PMOS transistor 81 is connected to the node 70. The drain terminal of the PMOS transistor 81 is connected to ground. The gate terminal of the PMOS transistor 81 is connected to a node 73 of the track and hold circuit 1. In FIG. 2a, the node 73 is the input node of the track and hold circuit 1.

In some CMOS fabrication processes, PMOS transistors may be fabricated in individual wells, whereas NMOS transistors are fabricated in a common substrate. In such a fabrication process, the bulk terminal of the PMOS transistor 81 may be connected to the source terminal of the PMOS transistor 81, as shown in FIG. 2a. Doing so results in a constant source-to-bulk voltage of the PMOS transistor 81, and, consequently, a constant threshold voltage of the PMOS transistor 81. In turn, this results in that the PMOS transistor 81, in combination with the current source 50 and the NMOS transistor 31, constitutes a highly linear source-follower circuit.

In addition to relaxing the requirements on the output impedance of the voltage source 40, the inclusion of the buffer device 80 may reduce the amount of signal current or AC current drawn from the voltage source 40 during the track phase. This in turn results in an overall further improved linearity since nonlinearities in the voltage source 40 are suppressed.

Figure 2B:
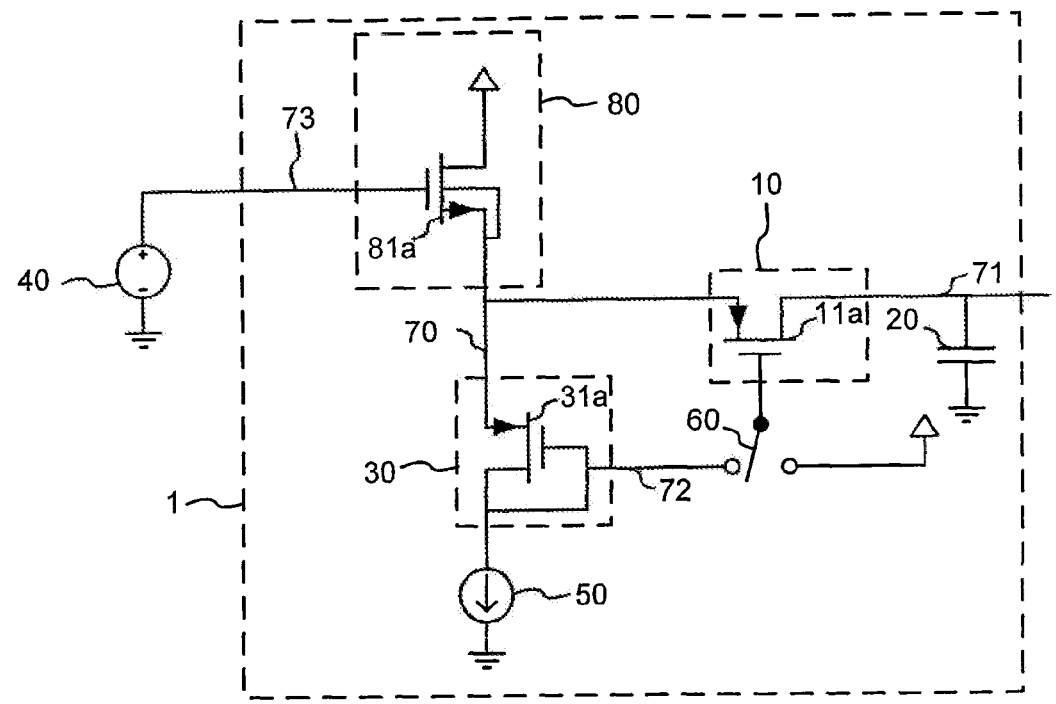
FIG. 2b is a schematic circuit diagram of a track and hold circuit according to another embodiment.

FIG. 2b shows the track and hold circuit 1 of FIG. 2a, except that the NMOS transistors 11 and 31 are replaced with PMOS transistors 11a and 31a, respectively, and PMOS transistor 81 is replaced with an NMOS transistor 81a.

Figure 3A:
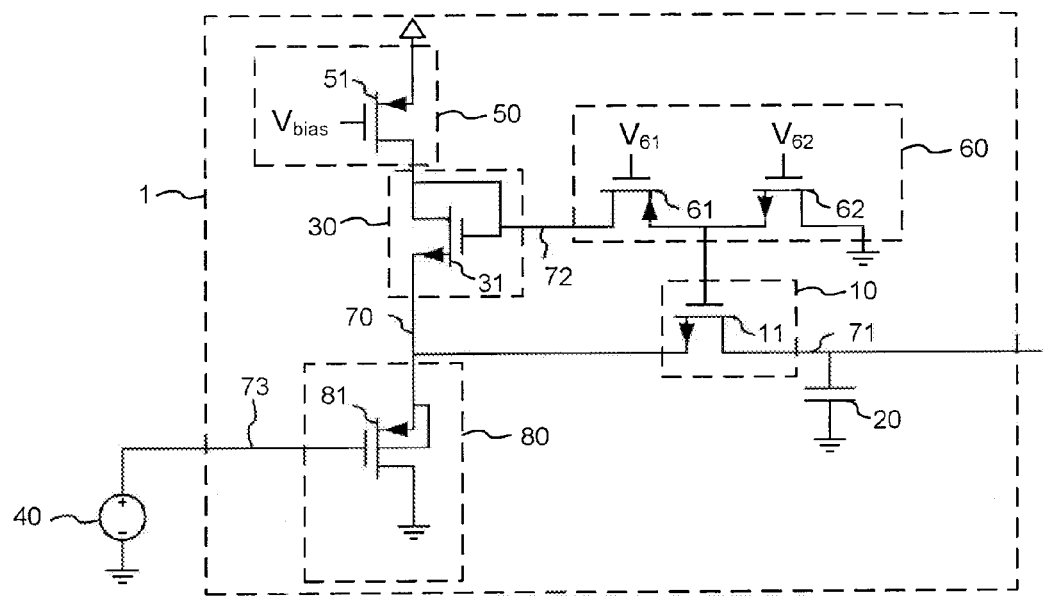
FIG. 3a is a schematic circuit diagram of a track and hold circuit according to a another embodiment.

FIG. 3a shows a schematic circuit diagram of a more detailed embodiment of the track and hold circuit 1 of FIG. 2a, where the current source 50 and the first control switch 60 are realized with MOS transistors. The current source 50 is realized with a single PMOS transistor 51. The source terminal of the PMOS transistor is connected to the supply voltage. The drain terminal of the PMOS transistor 51 is connected to the node 72. A DC bias voltage $V_{bias}$ is supplied to the gate terminal of the PMOS transistor 51. The first control switch 60 is realized with a PMOS transistor 61 and an NMOS transistor 62. The PMOS transistor 61 is operatively connected between the gate terminal of the NMOS transistor 11 and the node 72. The NMOS transistor 62 is operatively connected between the gate terminal of the NMOS transistor 11 and ground. A control-signal voltage $V_{61}$ is supplied to the gate terminal of the PMOS transistor 61. Another control-signal voltage $V_{62}$ is supplied to the gate terminal of the NMOS transistor 62.

Figure 3B:
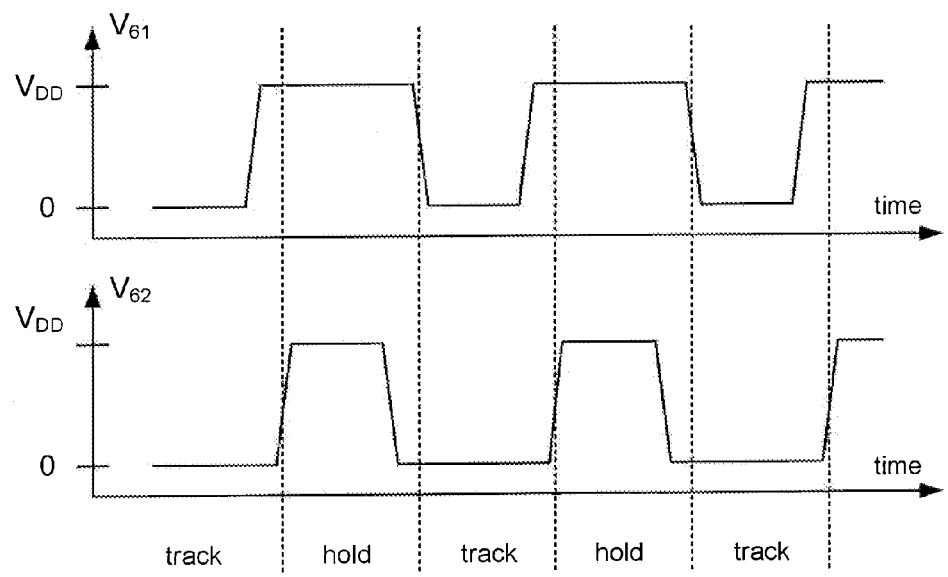
FIG. 3b show example waveforms for controlling the track and hold circuit of FIG. 3a according to another embodiment.

Example waveforms for the control-signal voltages $V_{61}$ and $V_{62}$ that may be used for controlling the first control switch 60 are shown in FIG. 3b. The track phase is initiated by setting $V_{61}$ to a first value, the first value being such that the PMOS transistor 61 is conducting. As a consequence, the gate terminal of the NMOS transistor is connected to the node 72, where the control voltage generated by the track-voltage generating device is supplied. In the example in FIG. 3b, the first value is 0 V, but other values such that the PMOS transistor 61 is conducting may also be used. During the hold phase, $V_{61}$ is set to a second value, the second value being such that the PMOS transistor 61 is nonconducting. In the example in FIG. 3b, the second value is equal to the supply voltage ($V_{DD}$), but other values such that the PMOS transistor 61 is nonconducting may also be used.

During the track phase, $V_{62}$ is set to a first value, the first value being such that the NMOS transistor 62 is 35 nonconducting. In the example in FIG. 3b, the first value is 0 V, but other values such that the NMOS transistor 62 is nonconducting may also be used. The hold phase is initiated by setting V62 to a second value, the second value being such that the NMOS transistor 62 is conducting. As a consequence, the gate of the NMOS transistor 11 is grounded and the NMOS transistor is set to a nonconducting state. In the example in FIG. 3b, the second value is equal to the supply voltage ($V_{DD}$), but other values such that the NMOS transistor 62 is conducting may also be used.

To avoid having a direct path between the current source 50 and ground, other than that provided by the track-voltage generating device 30 and the buffer device 80, the waveforms for $V_{61}$ and $V_{62}$ may be chosen such that the PMOS transistor 61 and the NMOS transistor 62 are never simultaneously conducting. Therefore, in the transitions between the track and hold phases, there is a period of time wherein neither of the PMOS transistor 61 and the NMOS transistor 62 are conducting. Having the PMOS transistor 61 and the NMOS transistor 62 simultaneously conducting would result in undesired transients on the track-voltage generated at node 72 and the voltage in the node 70, which may degrade the performance of the track and hold circuit 1.

Figure 3C:
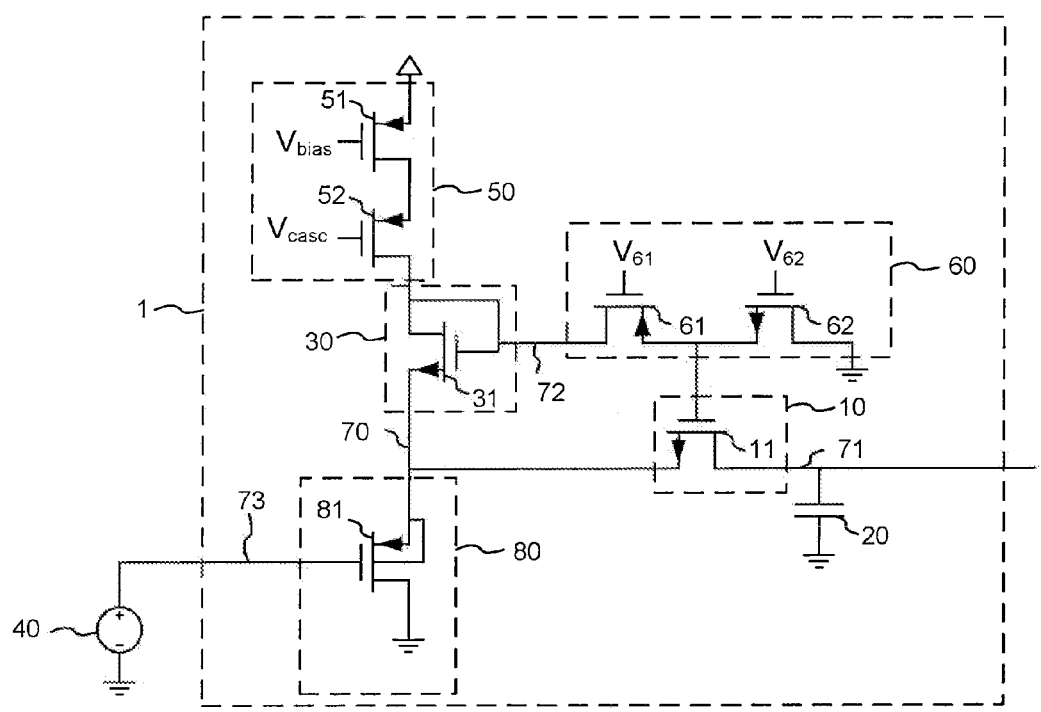
FIG. 3c is a schematic circuit diagram of a track and hold circuit according to another embodiment.

A schematic circuit diagram of an alternative embodiment of the track and hold circuit of FIG. 2a is shown in FIG. 3c. In the embodiment, the current source 50 is realized with the PMOS transistor 51, biased with the voltage $V_{bias}$, connected in series with a PMOS transistor 52, which is in turn connected to the track-voltage generating device 30. The PMOS transistor 52 is biased by applying a voltage $V_{casc}$ to its gate terminal. The PMOS transistor 52 is adapted to act as a cascode transistor, increasing the output resistance of the current source 50 compared with the embodiment of FIG. 3a. This may further improve the overall linearity of the track and hold circuit 1, since variations in the current $I_{bias}$, e.g., due to variations in the input signal supplied by the voltage source 40, may be reduced.

Figure 4A:
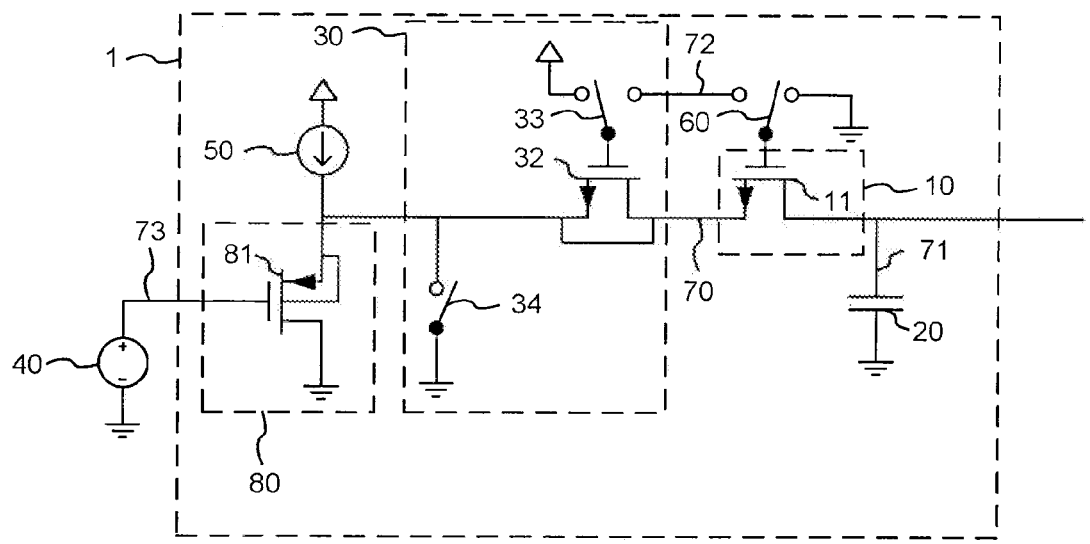
FIG. 4a is a schematic circuit diagram of a track and hold circuit according to another embodiment.

An alternative embodiment of the track and hold circuit 1 is illustrated with a schematic circuit diagram in FIG. 4a. In the embodiment, the current source 50 is connected between the supply voltage and the drain terminal of the PMOS transistor 81 of the buffer device 80. The track-voltage generating device 30 includes an NMOS transistor 32, having its drain and source terminals shorted and connected to the node 70. The bulk terminals (not shown) of the NMOS transistor 11 and 32 are connected to a common node, such as ground. The NMOS transistors 11 and 32 have approximately the same threshold voltage. Hence, in this embodiment, the track-voltage generating device 30 tracks the threshold voltage variations in the NMOS transistor 11 in that the threshold voltage of the NMOS transistor 32 in the track-voltage generating device 30 approximately follows the threshold voltage of the NMOS transistor 11. In an embodiment, the NMOS transistor 32 has the same width and the same length as the NMOS transistor 11. The track-voltage generating device further includes a second control switch 33 and a third control switch 34. The second control switch 33 is adapted to selectively connect the gate terminal of the NMOS transistor 32 either to a first fixed voltage, such as the supply voltage $V_{DD}$, or to the node 72. The third control switch 34 is adapted to connect the drain and source terminals of the NMOS transistor 32 to a second fixed voltage, such as ground, when the control switch 34 is closed.

Figure 4B:
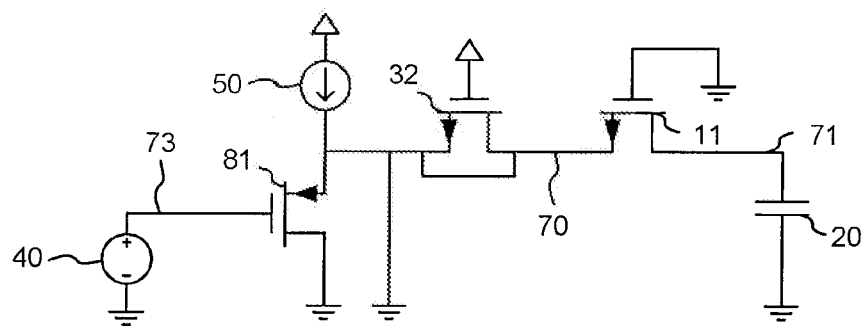
FIG. 4b is a simplified schematic circuit diagram of the track and hold circuit of FIG. 4a during a track phase.

A simplified schematic circuit diagram of the embodiment of FIG. 4a during the hold phase is shown in FIG. 4b. The third control switch 34 is closed. The second control switch 33 connects the gate terminal of the NMOS transistor 32 to the first fixed voltage. The NMOS transistor 32 acts as a capacitor and stores a channel charge $Q_A$ during the hold phase. Since the NMOS transistor is connected between two fixed voltages, $Q_A$ is the same for all hold periods. The first control switch 60 connects the gate terminal of the NMOS transistor 11 to ground as before.

Figure 4C:
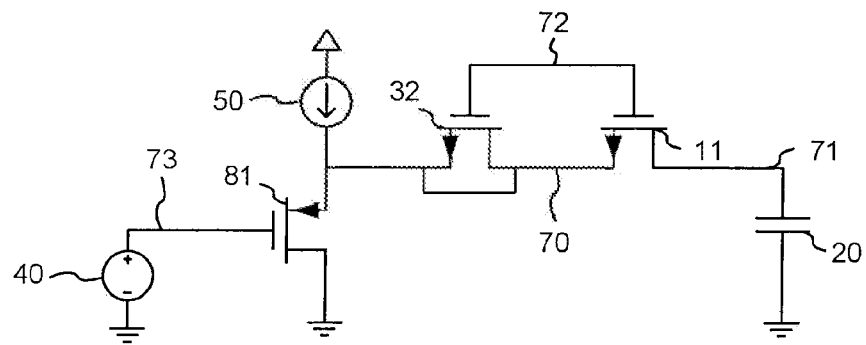
FIG. 4c is a simplified schematic circuit diagram of the track and hold circuit of FIG. 4a during a hold phase.

A simplified schematic circuit diagram of the embodiment of FIG. 4a during the track phase is shown in FIG. 4c. The third control switch 34 is open. The second control switch 33 and the first control switch 60 connect the gate terminals of the NMOS transistors 32 and 11, respectively, to the node 72. Due to that the NMOS transistors 32 and 11 have the same width, the same length, and approximately the same threshold voltage, the channel charge $Q_A$ is distributed such that the NMOS transistors 32 and 11 each are given a channel charge $Q_A/2$. Hence, the control voltage generated at node 72 is such that channel charge $Q_{CH} = Q_A/2$ of the NMOS transistor 11 is constant during the track phase and the same for all track phases. Consequently, the on resistance $R_{ON}$ of the NMOS transistor 11 is also constant during the track phase and the same for all track phases.

In alternative embodiments, the NMOS transistors 11 and 32 may be unequally sized. Then, a fraction of the charge $Q_A$ different from $Q_A/2$ will be redistributed to the NMOS transistor 11 during the track phase. This fraction of the charge $Q_A$ is constant during the track phase and the same for all track phases. Consequently, the on resistance $R_{ON}$ of the NMOS transistor 11 is also constant during the track phase and the same for all track phases.

Figure 4D:
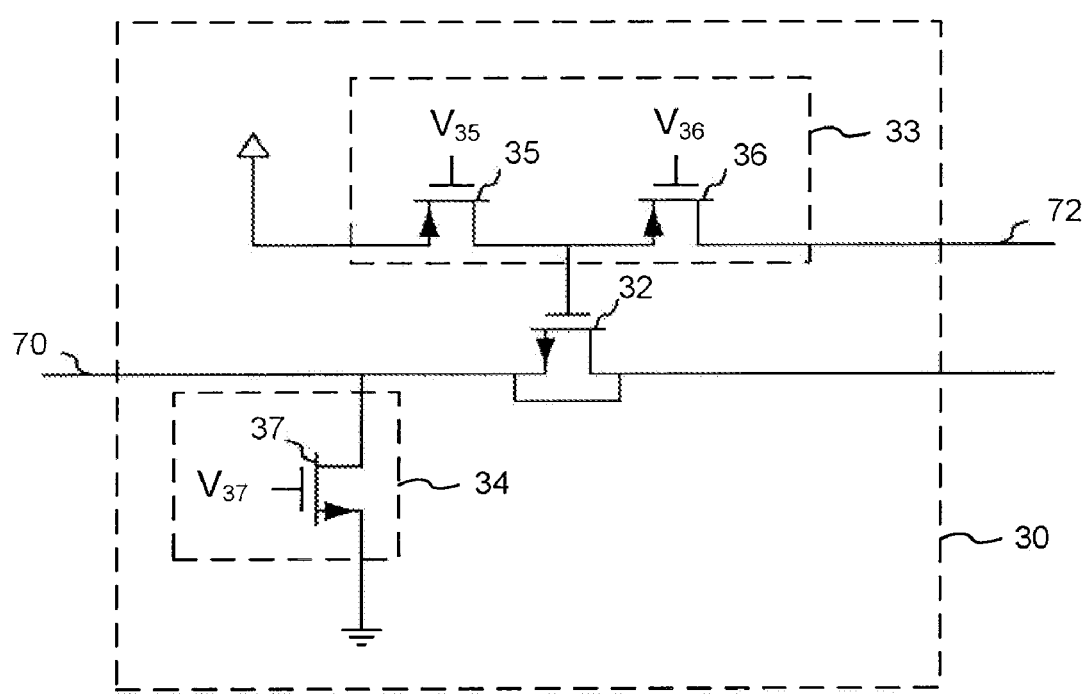

The first control switch 60 may be implemented as in the embodiments of FIG. 3a and FIG. 3c and may, e.g., be controlled with voltage waveforms such as those shown in FIG. 3b. The second control switch 33 and the third control switch 34 may be implemented according to the illustration in FIG. 4d, showing a more detailed schematic circuit diagram of an embodiment of the track-voltage generating device 30 that may be used in the embodiment of the track and hold circuit 1 shown in FIG. 4a. In the embodiment, the second control switch 33 is realized with two PMOS transistors 35 and 36. The PMOS transistor 35 is connected with its source terminal to the supply voltage and its drain terminal to the gate terminal of the NMOS transistor 32. A control voltage $V_{35}$ is supplied to the gate terminal 10 of the PMOS transistor 35 for controlling the operation of the PMOS transistor 35. The PMOS transistor 36 is connected with its source terminal to the gate terminal of the NMOS transistor 32 and its drain terminal to the node 72. A control voltage $V_{36}$ is supplied to the gate terminal of the PMOS transistor 36 for controlling the operation of the PMOS transistor 36.

During the hold phase, $V_{35}$ may be set to a first value, the first value being such that the PMOS transistor 35 is conducting. The first value may e.g. be 0 V. During the track phase, $V_{35}$ may be set to a second value, the second value being such that the PMOS transistor 35 is nonconducting. The second value may e.g. be $V_{DD}$.

During the hold phase, $V_{36}$ may be set to a first value, the first value being such that the PMOS transistor 36 is nonconducting. The first value may e.g. be $V_{DD}$. During the track phase, $V_{36}$ may be set to a second value, the second value being such that the PMOS transistor 36 is conducting. The second value may, e.g., be 0 V. In the transitions between the track and the hold phases, the waveforms of $V_{35}$ and $V_{36}$ should be such that the PMOS transistors 35 and 36 are never simultaneously conducting.

In the embodiment of FIG. 4d, the third control switch 34 is realized with an NMOS transistor 37. The NMOS transistor 37 is connected with its source terminal to ground and its drain terminal to the node 70. A control voltage $V_{37}$ is supplied to the gate terminal of the NMOS transistor 37 for controlling the operation of the NMOS transistor 37. During the hold phase, the control voltage $V_{37}$ may be set to a first value, the first value being such that the NMOS transistor 37 is conducting. The first value may, e.g., be $V_{DD}$. During the track phase, the control voltage $V_{37}$ may be set to a second value, the second value being such that the NMOS transistor 37 is nonconducting. The second value may, e.g., be 0 V. In the transitions between the track phase and the hold phase, the waveform of the control voltage $V_{37}$ should be such that the NMOS transistor 37 is never conducting during the track phase.

Figure 5:
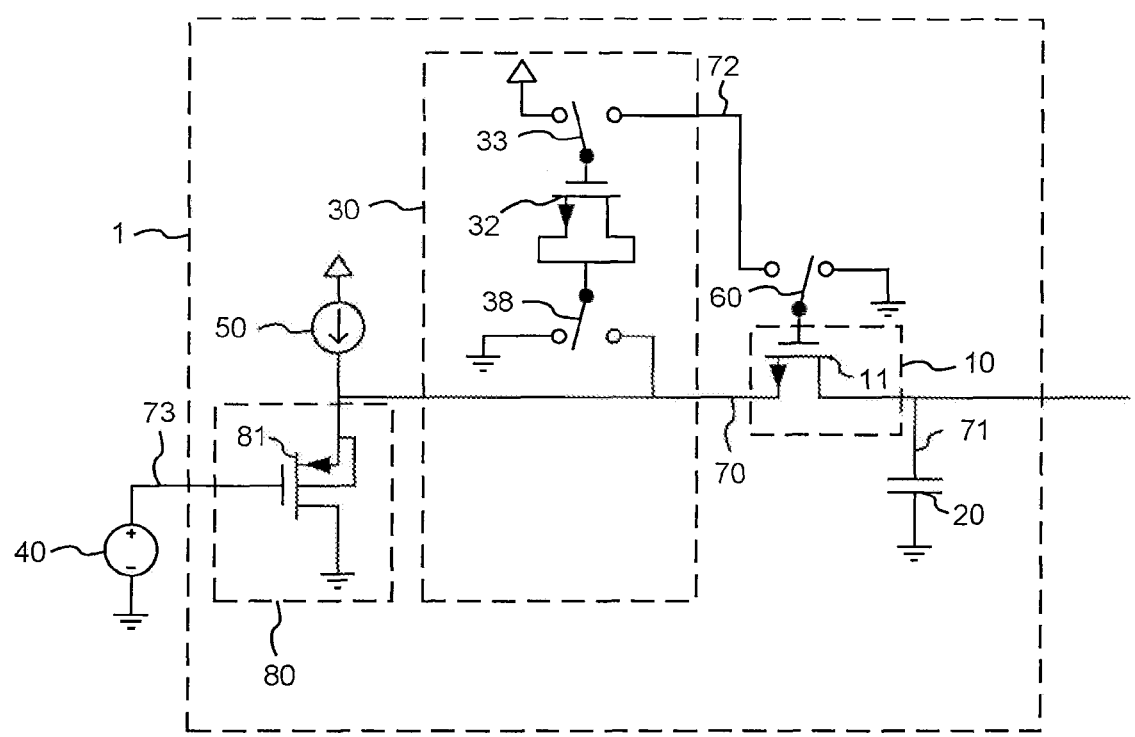
FIG. 5 is a schematic circuit diagram of a track and hold circuit according to another embodiment.

FIG. 5 shows a circuit diagram of an alternative embodiment to the embodiment of FIG. 4a. A difference between the embodiments of FIG. 5 and FIG. 4a is that in FIG. 5, the shorted drain and source terminals of the NMOS transistor 32 are connected to a control switch 38 and in the FIG. 4a, the shorted drain and source terminals of the NMOS transistor 32 are connected directly to the node 70. The control switch 38 may be arranged to connect the shorted drain and source terminals of the NMOS transistor 32 to a fixed voltage, such as ground, during the hold phase. The control switch 38 may further be arranged to connect the shorted drain and source terminals of the NMOS transistor 32 to the node 70 during the track phase. A further difference between the embodiments of FIG. 5 and FIG. 4a is that the control switch 34 in FIG. 4a may be omitted in the embodiment of FIG. 5.

The embodiment of the track and hold circuit 1 shown in FIG. 5 may be operated in a similar way as the embodiment of FIG. 4a. During the hold phase, the control switch 33 may be set to connect the gate terminal of the NMOS transistor 32 to a first fixed voltage, such as $V_{DD}$, and the control switch 38 may be set to connect the shorted drain and source terminals of the NMOS transistor 32 to a second fixed voltage, such as ground. Thereby, the NMOS transistor 32 may be charged with a predetermined electrical charge during the hold phase. The control switch 60 may be set to connect the gate terminal of the NMOS transistor 11 to ground.

During the track phase, the control switch 33 may be set to connect the gate terminal of the NMOS transistor 32 to the node 72 and the control switch 38 may be set to connect the shorted drain and source terminals of the NMOS transistor 32 to the node 70. The control switch 60 may be set to connect the gate terminal of the NMOS transistor 11 to the node 72. Thereby, a fraction of the predetermined charge stored in the NMOS transistor 32 during the hold phase may be redistributed to the NMOS transistor 11 during the track phase. As in the embodiment of FIG. 4a, this fraction of the predetermined charge is constant during the track phase and the same for all track phases. Consequently, the on resistance $R_{ON}$ of the NMOS transistor 11 is also constant during the track phase and the same for all track phases.

In alternative embodiments to the embodiments of FIG. 4a and FIG. 5, the buffer device 80 and the current source 50 may be omitted and the voltage source 40 for supplying the input signal to the track and hold circuit 1 may be connected to the node 70.

Figure 6:
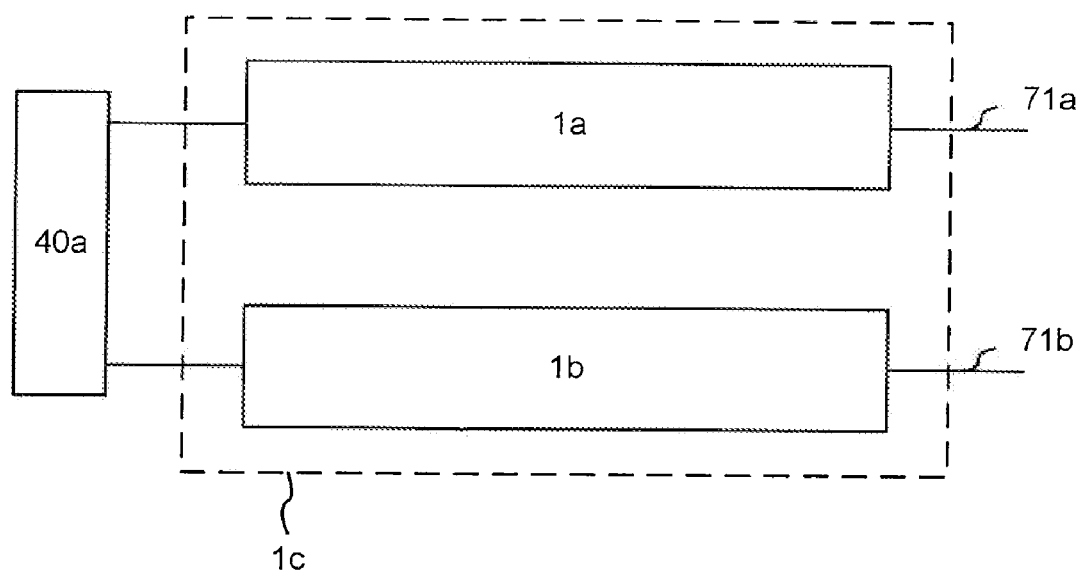
FIG. 6 is a block diagram of a differential track and hold circuit according to an embodiment.

The embodiments of the track and hold circuit 1 presented so far are single-ended track and hold circuits. FIG. 6 shows a block diagram of an embodiment of a differential track and hold circuit 1c. It comprises a 30 first single ended track and hold circuit 1a and a second single-ended track and hold circuit 1b. A differential voltage source 40a is operatively connected to the differential track and hold circuit 1c for supplying a differential input signal to the differential track and hold circuit 1c. The differential voltage source 40a is not a part of the differential track and hold circuit 1c. It is included in FIG. 6 to put the differential track and hold circuit 1c in a context. The single-ended track and hold circuits 1a and 1b may have identical design and may each include a track-voltage generating device 30 and a switch device 10, e.g. according to any of the embodiments described above. The single-ended track and hold circuits 1a and 1b have associated output nodes 71a and 71b, respectively, together constituting a differential output of the differential track and hold circuit 1c. Due to the use of the track-voltage generating device 30, the channel charge injected from the switch device 10 in the transition from the track phase to the hold phase is the same for both single-ended track and hold circuits 1a and 1b. Hence, the channel charge injection results in a pure common-mode error that cancels in the differential output. If instead known track and hold circuits were to be used in a differential setting, the channel charge injection may differ between branches in the differential output and only cancel partially.

In the embodiments presented where the buffer device 80 is included in the track and hold circuit 1, it is possible to increase the flexibility of the track and hold circuit, as will be described in the following. The switch device 10 and the capacitive hold device 20 provide a load to the buffer device 80. The bandwidth of the track and hold circuit 1 may be determined by that load and a transconductance $g_m$ of the buffer device 80. Increasing the transconductance $g_m$ may increase the bandwidth of the track and hold circuit 1. The transconductance $g_m$ may, e.g., be increased by increasing a multiplier of the buffer device 80, as will be described in the following with a few example embodiments.

Figure 7A:
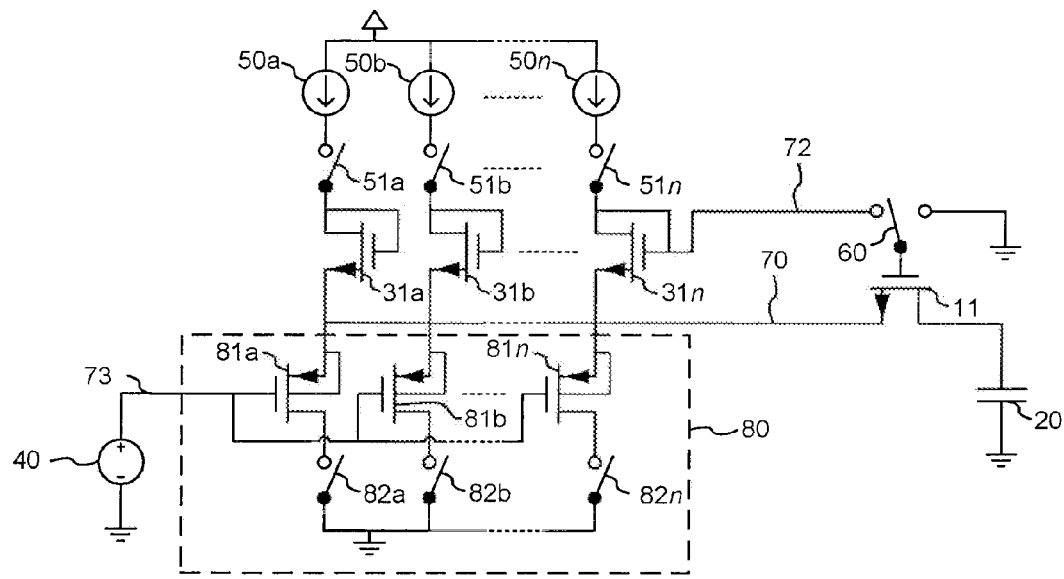
FIG. 7a and FIG. 7b are schematic circuit diagrams of track and hold circuits according to embodiments.

FIG. 7a is a schematic circuit diagram of an alternative embodiment of the track and hold circuit 1. In this embodiment, the track-voltage generating device 30 is implemented as in the embodiment of FIG. 2a. In FIG. 7a, the buffer device 80 comprises a plurality of PMOS transistors 81a, 81b, ..., 81n. To the drain terminal of each of the plurality of PMOS transistors 81a, 81b, ..., 81n, there is connected an enable switch 82a, 82b, ..., 82n. The PMOS transistors 81a, 81b, ..., 81n may be equally sized. The enable switches 82a, 82b, ..., 82n may be realized with NMOS transistors. The track and hold circuit 1 further comprises a plurality of current sources 50a, 50b, ..., 50n, a plurality of diode-connected NMOS transistors 31a, 31b, ..., 31n, and a plurality of enable switches 51a, 51b, ..., 51n. The enable switches 51a, 51b, ..., 51n may, e.g., be realized with PMOS transistors. In an embodiment where the PMOS transistors 81a, 81b, ..., 81n are equally sized, the current sources 50a, 50b, ..., 50n may be adapted to all generate the same current and the diode-connected NMOS transistors 31a, 31b, ..., 31n may be equally sized as well. In alternative embodiments, some or all of the PMOS transistors 81a, 81b, ..., 81n may be unequally sized. In these embodiments, the current sources 50a, 50b, ..., 50n and the diode-connected NMOS transistors 31a, 31b, ..., 31n may be dimensioned accordingly. For example, if the width-over-length ratio (W/L) for the PMOS transistor 81b is K times larger than the width-over-length ratio of the PMOS transistor 81a, where K is a real number, the current source 50b may be adapted to generate a current that is K times larger than the current generated by the current source 50a and the diode-connected NMOS transistor 31b may be given a width-over-length ratio that is K times larger than the width-over-length ratio of the diode-connected NMOS transistor 31a, etc.

The current source 50a may be connected in series with the enable switch 51a, which in turn may be connected via the diode connected NMOS transistor 31a to the source terminal of the PMOS transistor 81a. Further, the current source 50b may be connected in series with the enable switch 51b, which in turn may be connected via the diode connected NMOS transistor 31b to the source terminal of the PMOS transistor 81b, etc. The source terminals of the PMOS transistors 81a, 81b, ..., 81n may all be connected to the node 70. The gate terminals of the PMOS transistors 81a, 81b, ..., 81n may all be connected to the input node 73 of the track and hold circuit 1. In the embodiment of FIG. 7a, the gate terminal of the NMOS transistor 31n is connected to the node 72. In an alternative embodiment, the gate terminals of the NMOS transistors 81a, 81b, ..., 81n may all be connected to the node 72. In a further alternative embodiment, the gate terminals of a subset of the NMOS 1S transistors 81a, 81b, ..., 81n may all be connected to the node 72.

In an embodiment, the enable switches 51a, 51b, ..., 51n and 82a, 82b, ..., 82n are controlled such that the enable switch 51a is closed if and only if the enable switch 82a is closed, the enable switch 51b is closed if and only if the enable switch 82b is closed, etc. The track and hold circuit 1 is flexible, e.g., in that if a larger bandwidth is desired, this may be obtained by closing more enable switches 51a, 51b, ..., 51n and 82a, 82b, ..., 82n. In doing so, the overall $g_m$ of the buffer device 80 is increased. The increased bandwidth comes to the cost of an increased power consumption. If, on the other hand, a reduced power consumption is desired, this may be obtained by opening more enable switches 51a, 51b, ..., 51n and 82a, 82b, ..., 82n. The reduction in power consumption comes to the cost of a reduced bandwidth.

The flexibility of the track and hold circuit 1 is advantageous, e.g., in applications where different bandwidth requirements are present in different configurations. An example of such an application is when the track and hold circuit is used in an ADC in a computer display such as a VGA projector or an LCD monitor. Different screen resolutions and update rates set different bandwidth requirements on the track and hold circuit 1. By configuring the track and hold circuit 1 such that the bandwidth of the track and hold circuit 1 meets the bandwidth requirement but does not have an excessively large bandwidth, power savings may be achieved compared with using a track and hold circuit designed with a fixed bandwidth meeting the highest bandwidth requirement in the application.

Other solutions than that depicted in FIG. 7a may also be used to obtain flexibility in power consumption and bandwidth. For example, the enable switches 51a, 51b, ..., 51n may be placed between the current sources 50a, 50b, ..., 50n and the supply voltage instead. Alternatively, the enable switches 51a, 51b, ..., 51n may be removed and the current sources 50a, 50b, ..., 50n may be switched on or off by instead controlling a bias voltage for each current source 50a, 50b, ..., 50n. Further, those of the diode connected NMOS transistors 31a, 31b, ..., 31n that do not have their gate terminals connected to the node 72 may be omitted, e.g., to save circuit area.

Figure 7B:
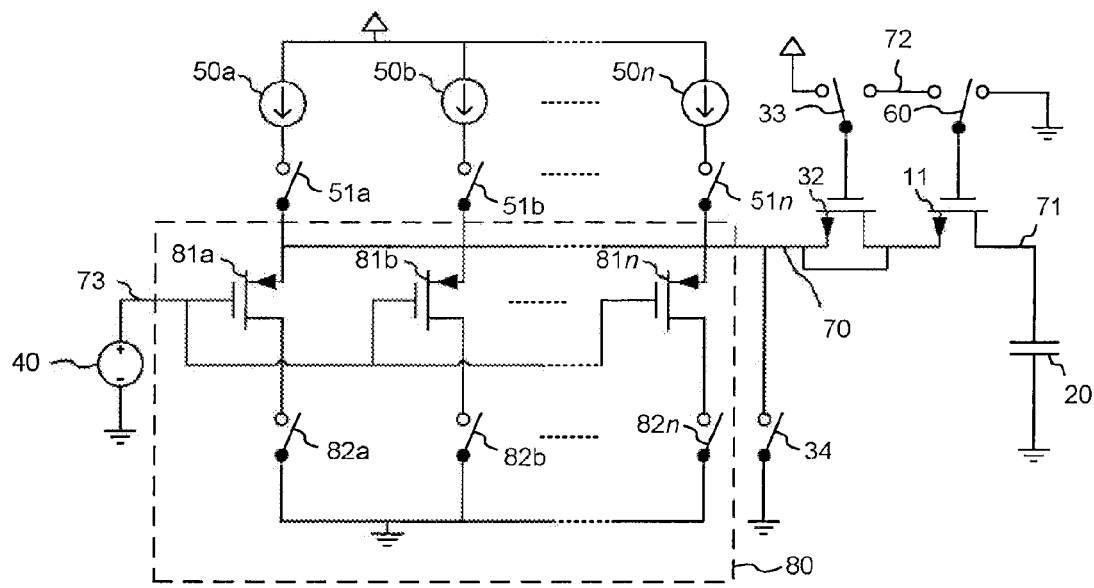

A schematic circuit diagram of a further alternative embodiment of the track and hold circuit 1 with flexibility in bandwidth and power consumption is shown in FIG. 7b. In this embodiment, the track-voltage generating device 30 is implemented as in the embodiment of FIG. 4a. The enable switches 51a, 51b, ..., 51n and 82a, 82b, ..., 82n may be controlled as described above in the context of the embodiment of FIG. 7a. Variations in the circuit structure, such as those described in the context of FIG. 7a, may apply also to the embodiment of the track and hold circuit 1 of FIG. 7b.

The PMOS transistors 81a, 81b, ..., 81n together with the enable switches 51a, 51b, ..., 51n, 82a, 82b, ..., 82n and the current sources 50a, 50b, ..., 50n shown in FIG. 7b form a flexible input buffer amplifier for the track and hold circuit 1. Such a flexible input buffer amplifier may be used also in track and hold circuits of other types than those described in the above embodiments for obtaining a flexibility in power consumption and bandwidth.

In the embodiments described so far, the switch device 10 has been embodied as an NMOS transistor 11. In alternative embodiments, the switch device 10 may be embodied as a PMOS transistor. This may require modifications to the track and hold circuit 1, such as replacing NMOS transistors with PMOS transistors and vice versa, and interchanging connections to ground and $V_{DD}$. Specifically, the NMOS transistors 31 and 32 used in the track-voltage generating device 30 in the embodiments described above should be replaced with PMOS transistors if a PMOS transistor is used in the switch device 10. Such modifications would be obvious to the skilled person. Other modifications, such as implementing current sources with multiple cascode transistors or bipolar junction transistors (BJTs) and/or using BJTs in the buffer device 80, are possible without departing from the scope of the invention.

It is an advantage of the embodiments described above that improved signal-to-noise-and-distortion ratio (SNDR) may be obtained with only a relatively small amount of hardware in addition to the switch device 10 and the capacitive hold device 20. Hence, the cost in terms of circuit area and power dissipation may be low. It is a further advantage that the improvement of SNDR is, at least in part, based on matching, such as threshold-voltage matching, between two components of the same type, for example NMOS transistors 11 and 31 (FIGS. 1a-c, 2, 3a and c, and 6a) or NMOS transistors 11 and 32 (FIGS. 4a-c, 6b). Circuit parameters for the two components that should be matched may vary e.g. between individual chips and in time (e.g., due to temperature variations and aging). However, if the two components that should be matched are implemented on the same chip and placed closely together, e.g. using an interdigitized layout, good matching may be obtained.

The track and hold circuit 1 may be comprised in an ADC. The ADC may be, but is not limited to, any of a time-interleaved ADC, a successive-approximation ADC, a parallel successive approximation ADC, a flash ADC, or a pipelined ADC. The track and hold circuit 1 may be comprised in an integrated circuit. Further, the track and hold circuit may be comprised in an electronic apparatus. The electronic apparatus may be but is not limited to a monitor, such as a VGA monitor, a projector, a television set, or a radio transceiver.

The present invention has been described above with reference to specific embodiments. However, other embodiments than the above described are possible within the scope of the invention. The different features and steps of the invention may be combined in other combinations than those described. The scope of the invention is only limited by the appended patent claims.

What is claimed is:

1. A track and hold circuit, comprising;
a first switch device including a first MOS transistor, the first MOS transistor having a gate terminal, an input terminal, and an output terminal, the gate terminal being configured to receive a control voltage;
a capacitive hold device electrically coupled to the output terminal of the first MOS transistor; and
a track-voltage generating device coupled to the first switch device, the track-voltage generating device being configured to generate the control voltage based on a signal on the input terminal of the first MOS transistor and to supply the control voltage to the gate terminal of the first MOS transistor during track phases, the control voltage providing a channel charge to the first MOS transistor that is the same for each track phase, the track-voltage generating device including a second MOS transistor having a drain terminal and a source terminal that are shorted together, the second MOS transistor being configured to be charged with a predetermined electrical charge during a hold phase and to generate the control voltage during the track phases by redistributing a predetermined fraction of the predetermined charge to the first MOS transistor.

2. The track and hold circuit of claim 1, wherein the first and second MOS transistors are both NMOS transistors.

3. The track and hold circuit of claim 1, further comprising a buffer device coupled to the input terminal of the first MOS transistor.

4. The track and hold circuit of claim 3, wherein the buffer device comprises at least one MOS transistor coupled in a source-follower configuration.

5. The track and hold circuit of claim 4, wherein each MOS transistor of the at least one MOS transistor is an NMOS transistor.

6. The track and hold circuit of claim 4, wherein a bias current of each MOS transistor of the at least one MOS transistor is configured to be selectively enabled.

7. The track and hold circuit of claim 4, wherein the input terminal of the first MOS transistor is a source terminal of the first MOS transistor and the output terminal of the first MOS transistor is a drain terminal of the first MOS transistor.

8. The track and hold circuit of claim 7, wherein:
the source terminal of the first MOS transistor is electrically coupled to the source and drain terminals of the second MOS transistor;
the gate terminal of the first MOS transistor is electrically coupled to a first switch;
the gate terminal of the second MOS transistor is electrically coupled to a second switch; and
the source and drain terminals of the second MOS transistor are electrically coupled to a third switch.

9. The track and hold circuit of claim 8, wherein:
the first switch is configured to selectively connect the gate terminal of the first MOS transistor to one of a first fixed voltage and a first node;
the second switch is configured to selectively connect the gate terminal of the second MOS transistor to one of a second fixed voltage and the first node; and
the third switch is configured to selectively connect the drain and source terminals of the second MOS transistor to the first fixed voltage when the third switch is closed.

10. The track and hold circuit of claim 9, wherein:
the first switch comprises a third MOS transistor and a fourth MOS transistor coupled in series between the first node and the first fixed voltage;
the second switch comprises a fifth MOS transistor and a sixth MOS transistor coupled in series between the second fixed voltage and the first node; and
the third switch comprises a seventh MOS transistor.

11. The track and hold circuit of claim 10, wherein:
the third MOS transistor is a PMOS transistor with a source terminal electrically coupled to the gate terminal of the first MOS transistor and a drain terminal electrically coupled to the first node; and
the fourth MOS transistor is an NMOS transistor with a source terminal electrically coupled to the gate terminal of the first MOS transistor and a drain terminal electrically coupled to the first fixed voltage.

12. The track and hold circuit of claim 11, wherein:
the fifth MOS transistor is a PMOS transistor with a source terminal electrically coupled to the second fixed voltage and a drain terminal electrically coupled to the gate terminal of the second MOS transistor;
the sixth MOS transistor is a PMOS transistor with a source terminal electrically coupled to the gate terminal of the second MOS transistor and a drain terminal electrically coupled to the first node; and
the seventh MOS transistor is an NMOS transistor with a source terminal electrically coupled to the first fixed voltage and a drain terminal electrically coupled to the drain and source terminals of the second MOS transistor.

13. The track and hold circuit of claim 8, wherein:
the first switch is configured to selectively connect the gate terminal of the first MOS transistor to one of a first fixed voltage and a first node;
the second switch is configured to selectively connect the gate terminal of the second MOS transistor to one of a second fixed voltage and the first node; and
the third switch is configured to selectively connect the drain and source terminals of the second MOS transistor to one of the first fixed voltage and the input terminal of the first MOS transistor.

14. The track and hold circuit of claim 1, wherein the track and hold circuit has a differential structure.

15. The track and hold circuit of claim 1, wherein the first MOS transistor has a first width and a first length, the second MOS transistor has a second width and a second length, the first width is the same as the second width, and the first length is the same as the second length.

16. The track and hold circuit of claim 1, wherein the first MOS transistor has a first width and a first length, the second MOS transistor has a second width and a second length, and wherein at least one of the first width and the first length is different than the second width and the second length, respectively.

* * * * *